(12) United States Patent
Sorin et al.

(10) Patent No.: US 10,700,494 B2
(45) Date of Patent: Jun. 30, 2020

(54) DATA CENTER TRANSMISSION SYSTEMS (71) Applicant: Hewlett Packard Enterprise Development LP, Houston, TX (US)

(72) Inventors: Wayne Victor Sorin, Mountain View, CA (US); Michael Renne Ty Tan, Menlo Park, CA (US); Sagi Varghese Mathai, Sunnyvale, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/082,270

(22) PCT Filed: Apr. 1, 2016

(86) PCT No.: PCT/US2016/025591
§ 371 (c)(1),
(2) Date: Sep. 4, 2018

(87) PCT Pub. No.: WO2017/171841
PCT Pub. Date: Oct. 5, 2017

(65) Prior Publication Data
US 2019/0115722 A1  Apr. 18, 2019

(51) Int. Cl.
*H01S 5/183* (2006.01)
*H01S 5/40* (2006.01)
(Continued)

(52) U.S. Cl.
CPC ........ *H01S 5/1833* (2013.01); *H01S 5/18333* (2013.01); *H01S 5/18361* (2013.01);
(Continued)

(58) Field of Classification Search
CPC .. H01S 5/18305; H01S 5/1833; H01S 5/4012; H01S 5/02284; H01S 5/18311;
(Continued)

(56) References Cited

U.S. PATENT DOCUMENTS

| 4,721,351 A | 1/1988 | Goepfert et al. |
| 5,825,489 A | 10/1998 | Lagakos et al. |

(Continued)

FOREIGN PATENT DOCUMENTS

JP   11-094695 A   4/1999

OTHER PUBLICATIONS

Haglund E.; "Quasi-single Mode VCSELs for Longer-reach Optical Interconnects"; Aug. 2013; 68 pages.
(Continued)

*Primary Examiner* — Armando Rodriguez
(74) *Attorney, Agent, or Firm* — Hewlett Packard Enterprise Patent Department (57) ABSTRACT

In the examples provided herein, a data center transmission system includes a VCSEL (vertical-cavity surface-emitting laser) that lases in a single spatial mode with a side mode suppression ratio of at least 25 dB, where the VCSEL is formed on a substrate and lases at a wavelength transparent to the substrate, and further where an output of the VCSEL exits through the substrate. Also, the VCSEL is directly modulated. The system further includes an optical fiber having a first end to receive the output of the VCSEL for propagation along the optical fiber. The optical fiber supports a single spatial mode without supporting higher order spatial modes over a range of wavelengths between 1260 nm and 1360 nm. The system also includes a receiver to receive the directly modulated output of the VCSEL after propagation through the optical fiber.

8 Claims, 9 Drawing Sheets

(51) Int. Cl.
*H04B 10/25* (2013.01)
*H01S 5/022* (2006.01)
*H01S 5/42* (2006.01)
*H01S 5/00* (2006.01)

(52) U.S. Cl.
CPC ............ *H01S 5/4012* (2013.01); *H04B 10/25* (2013.01); *H01S 5/005* (2013.01); *H01S 5/02284* (2013.01); *H01S 5/18305* (2013.01); *H01S 5/18311* (2013.01); *H01S 5/18341* (2013.01); *H01S 5/18369* (2013.01); *H01S 5/18375* (2013.01); *H01S 5/18394* (2013.01); *H01S 5/423* (2013.01); *H01S 2301/166* (2013.01)

(58) Field of Classification Search
CPC . H01S 5/18394; H01S 5/423; H01S 2301/166
See application file for complete search history.

(56) References Cited

U.S. PATENT DOCUMENTS

| | | | |
|---|---|---|---|
| 5,895,005 | A | 4/1999 | Simchock |
| 6,674,941 | B2 | 1/2004 | Tatum et al. |
| 7,266,180 | B1 | 9/2007 | Saunders et al. |
| 9,036,137 | B2 | 5/2015 | Goldstein et al. |
| 2002/0163688 | A1* | 11/2002 | Zhu .................. H04B 10/2581 398/144 |
| 2003/0026566 | A1 | 2/2003 | Diep et al. |
| 2003/0185269 | A1 | 10/2003 | Gutin |
| 2004/0208216 | A1* | 10/2004 | Naone .................. B82Y 20/00 372/45.013 |
| 2005/0013539 | A1 | 1/2005 | Chen et al. |
| 2008/0219307 | A1 | 9/2008 | Birkedal et al. |
| 2009/0262765 | A1* | 10/2009 | Chang ................. H01S 5/18305 372/26 |
| 2011/0318003 | A1 | 12/2011 | Brooks |
| 2014/0119397 | A1* | 5/2014 | Whitney ............... H01S 5/0222 372/50.1 |
| 2015/0071638 | A1 | 3/2015 | Heroux et al. |
| 2015/0205062 | A1 | 7/2015 | Collins et al. |
| 2016/0202418 | A1 | 7/2016 | Fortin et al. |

OTHER PUBLICATIONS

Tian Z. et al.; "850-nm VCSEL Transmission Over Standard Single-mode Fiber Using Fiber Mode Filter"; Mar. 1, 2012 3 pages.
International Search Report and Written Opinion received for PCT Patent Application No. PCT/US16/25591, dated Dec. 8, 2016, 13 pages.
International Search Report and Written Opinion received for PCT Patent Application No. PCT/US2016/042723, dated Jan. 17, 2017, 10 pages.
Robertson et al., "Modal Distribution & CPR", Kingfisher International, 2003, 4 pages.
Wikipedia, "Mandrel wrapping", available online at <https://en.wikipedia.org/w/index.php?title=Mandrel_wrapping&oldid=582462047 >, Nov. 20, 2013, 2 pages.

* cited by examiner

DATA CENTER TRANSMISSION SYSTEMS

BACKGROUND

When a VCSEL (vertical-cavity surface-emitting laser) lases in multiple transverse modes, and the output of the VCSEL propagates in an optical fiber, different modes are excited in the optical fiber that travel at different velocities. This phenomenon is known as modal dispersion, and the data signal pulses spread into wider pulses as they propagate along the fiber. The higher the data rate, the closer the data pulses are spaced. Thus, the link distance is limited by the distance over which the pulse widths do not increase enough to interfere with neighboring pulses. In data centers, optical signals may be routed over distances from about 50 meters up to a few kilometers. Thus, the impact of modal dispersion may prevent high data rate transmission systems from operating in a data center.

BRIEF DESCRIPTION OF THE DRAWINGS

The accompanying drawings illustrate various examples of the principles described below. The examples and drawings are illustrative rather than limiting.

DETAILED DESCRIPTION

Described below are transmission systems that are designed to be compatible with propagation distances encountered in data centers, for example from distances of approximately 50 meters up to a few kilometers. The data center transmission systems include a directly modulated VCSEL lasing in a single transverse mode. The data signal emitted from the VCSEL propagates along an optical fiber, and a receiver on the far end of the optical fiber receives the data signal from the VCSEL after propagation through the optical fiber. For a standard telecommunication optical fiber that supports a single spatial mode, the data center transmission system may permit the single mode VCSELs to be modulated above 25 Gb/s without the transmitted data being adversely affected by modal dispersion in the optical fiber. The single mode of the lasing VCSEL couples to fewer fiber modes, thus reducing the impact of modal dispersion.

Described below is a data center transmission system that includes a first VCSEL (vertical-cavity surface-emitting laser) that lases in a single transverse mode with a side mode suppression ratio of at least 25 dB, where the first VCSEL is formed on a first substrate and lases at a wavelength transparent to the first substrate, and an output of the first VCSEL exits through the first substrate, and the first VCSEL is directly modulated. The system also includes an optical fiber having a first end to receive the output of the first VCSEL for propagation along the optical fiber, where the optical fiber supports a single spatial mode without supporting higher order spatial modes over at least a range of wavelengths between 1260 nm and 1360 nm. Further, the system includes a first receiver to receive the directly modulated output of the first VCSEL after propagation through the optical fiber.

In some implementations, the first VCSEL is modulated at at least 25 Gb/s. In some implementations, the first substrate is gallium arsenide, and the first VCSEL lases at a wavelength in a range between 1030 nm and 1280 nm. In some implementations, the first VCSEL lases in a single polarization, and the system further includes an isolator positioned between the first VCSEL and the first end of the optical fiber to prevent unwanted feedback from entering the first VCSEL. In some implementations, the system also includes a spatial mode filter positioned to spatially filter light in the optical fiber.

The data center transmission system may also include a second VCSEL that lases in a single transverse mode with a side mode suppression ratio of at least 25 dB, where the second VCSEL is formed on a second substrate and lases at a wavelength transparent to the second substrate, and an output of the second VCSEL exits through the second substrate, and the second VCSEL is directly modulated. The system further includes a multiplexer to multiplex an output of the first VCSEL and an output of the second VCSEL, where an output of the multiplexer is directed to the first end of the optical fiber, and the output of the second VCSEL propagates along the optical fiber. Further, the system has a demultiplexer coupled to a second end of the optical fiber to demultiplex the output of the first VCSEL and the output of the second VCSEL. The system also includes a second receiver to receive the directly modulated output of the second VCSEL.

Figure 1A:
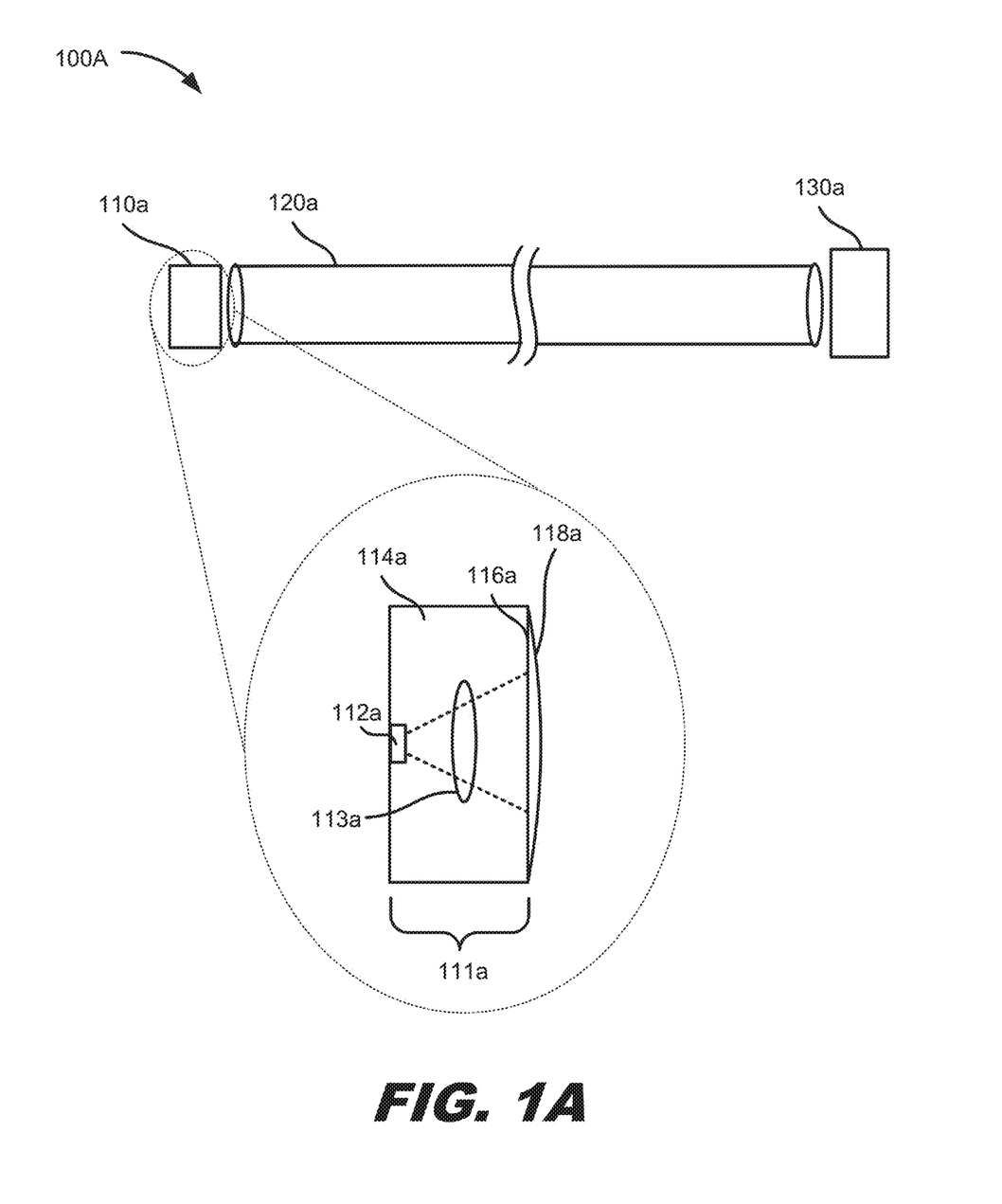
FIG. 1A depicts an example data center transmission system.

FIG. 1A depicts an example data center transmission system 100 that includes a transmitter 110a, an optical fiber 120a, and a receiver 130a. The transmitter 110a may include a VCSEL that lases in a single transverse mode.

The inset in FIG. 1A depicts details of the transmitter 110a that uses a VCSEL 111a as the optical source. The VCSEL 111a may be a bottom-emitting VCSEL configured to emit a light beam 113a from an active area 112a through the substrate 114a on which the VCSEL 111a is fabricated, and the substrate 114a is transparent or semi-transparent at the wavelengths of the emitted light beam 113a. While the industry term 'bottom-emitting' is used herein, there is no restriction on the orientation of the VCSEL 111a. Electrical circuitry for driving and directly modulating the VCSEL are not shown in the figure. The bottom emitting VCSEL may be wire bonded or, preferably, flip chipped to interface with electrical circuitry.

Coupled to the exit surface 116a of the VCSEL 111a may be an anti-reflection coated integrated lens 118a that refracts the emitted light beam 113a, for example, to focus or collimate the light beam 113a. By integrating the lens 118a on the exit surface 116a of the VCSEL 111a, the magnified output beam from the integrated lens 118a allows for lower-cost passive alignment packaging.

Figure 1B:
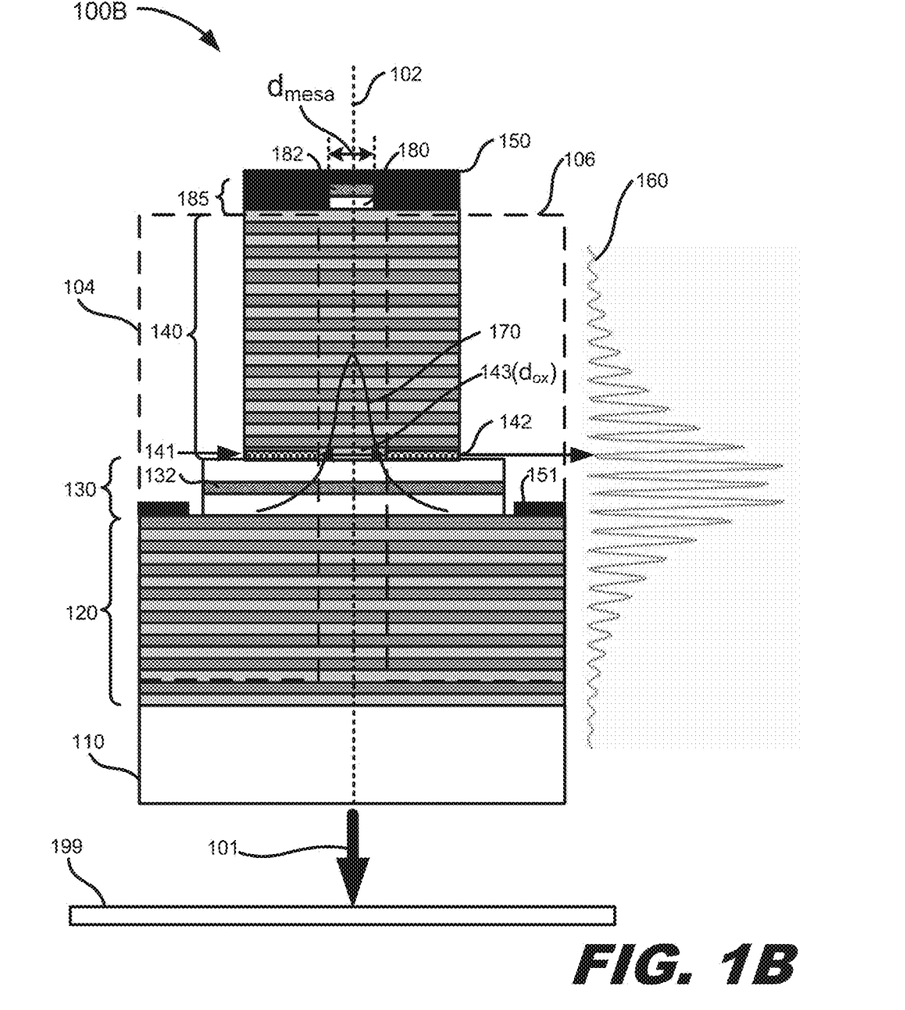
FIG. 1B depicts an example VCSEL (vertical-cavity surface-emitting laser) that lases in a single transverse mode.

FIG. 1B depicts a cross-sectional view of an example VCSEL (vertical-cavity surface-emitting laser) 100B that lases in a single transverse mode. The VCSEL 100B has a first reflector 140 having a first reflectivity and a second reflector 120 having a second reflectivity. Both the first reflector 140 and the second reflector 120 are distributed Bragg reflectors (DBRs) formed from alternating layers or pairs of two different semiconductor materials, where the optical thickness of each layer is one quarter of the lasing wavelength. The first reflector 140 is p-doped, and the second reflector 120 is n-doped, and the two different semiconductor materials have different indices of refraction. In alternate embodiments, the first reflector 140 is n-doped, and the second reflector 120 is p-doped. The substrate 110 may p-doped, n-doped, or semi-insulating. The first reflector 140 may have many fewer semiconductor laser pairs than the second reflector 120 so that it functions as a poor reflector. In fact, the reflectivity of the first reflector 140 may be so low that without additional reflectors, to be described below, the VCSEL 100B would not lase.

The second reflector 120 is fabricated on top of substrate 110. Between the first reflector 140 and the second reflector 120 is a one wavelength thick cavity 130 that has a light generating multiple quantum well (MQW) gain region 132 within. The MQW gain region 132 is positioned at the peak of a standing wave 160 in the cavity in the VCSEL 100B. The second reflectivity of the second reflector 120 is less than the first reflectivity of the first reflector 140, thus the VCSEL 100B emits light through the second reflector 120 in a direction indicated by the arrow 101. While directional words, such as top and over, are used in the description to indicate relative locations with respect to the orientation of the VCSEL 100B structure shown in the figures, the actual VCSEL 100B structure can be oriented in any direction.

Additionally, the VCSEL 100B has a semiconductor layer 141 that contains aluminum, such as Al(x)Ga(y)As, and part of the semiconductor layer 141 is converted into an insulating layer by exposing the semiconductor layer 141 to a water vapor environment. Water vapor enters the semiconductor layer 141 from the edges and moves toward the middle of the layer so that an outside portion of the Al(x)Ga(y)As layer is converted into an Al(x)O(y) layer 142. A central area in the middle of the Al(x)O(y) layer 142, along a central axis 102 of the VCSEL 100B, is left unoxidized, to leave an oxide aperture 143 in the semiconductor layer 141 surrounding the central axis 102. The oxide aperture 143 has a diameter $d_{ox}$. The Al(x)O(y) material has a lower index of refraction than the surrounding GaAs or Al(x)Ga(y)As material. Thus, there is effectively a lower index region 104, 106 surrounding the central oxide aperture 143. The index difference between the lower index regions 104, 106 and the oxide aperture 143 contributes to the optical confinement of the mode 170 in the VCSEL 100B. The insulating oxide 142 blocks the current within the VCSEL 100B, while the oxide aperture 143 allows the current to pass. The oxide layer 142 should be positioned at or near a null or node of the standing wave to minimize the difference in index of refraction between the lower index region 104, 106 and the high index central region.

To make the VCSEL lase in a single transverse mode, a high reflectivity mesa 185 is created in the central region of the VCSEL 100B with a layer of low refractive index dielectric 180, such as, but not limited to, $SiO_2$, Al(x)O(y), $Si_3N_4$, a polymer, positioned over the first reflector 140, where the refractive index of the dielectric is lower than that of the semiconductor layer pairs in the first reflector 140. The thickness of the dielectric layer 180 should be selected so that the threshold gain for lasing is lowest. In some cases, the thickness for a low threshold gain is close to a quarter wavelength thick, and the thickness for a high threshold gain is close to half a wavelength thick, with intermediate thicknesses yielding intermediate threshold gains. Then a metallic layer 182, such as gold, is positioned over the low refractive index dielectric layer 180. The metallic layer 182 is not limited to a single metal reflector layer, it can be a metal stack, for example Ti/Au and Cr/Au. The quarter wavelength thick low refractive index dielectric layer 180 and the metallic layer 182 make up the mesa 185. Because the reflectivity of the metallic layer is high, in combination with the first reflector 140 and the quarter wavelength thick low refractive index dielectric layer 180, the reflectivity of the center region should be equivalent to a high number of pairs of semiconductor layers in the DBR of the first reflector 140 alone. However in some instances, a DBR made of alternating layers of quarter wavelength thick dielectric materials, such as $SiO_2$ and $TiO_2$ can be used to enhance the reflectivity of the mesa 185. The approximately quarter wavelength thick dielectric layer 180 in combination with the metallic layer 182 has higher reflectivity compared to the metallic layer 182 alone. This property enables the use of lower cost and lower reflectivity metallic layer 182 such as, but not limited to, Ti, Pt, and Al.

A first ohmic contact 150 is positioned over the first reflector 140 and the mesa 185. A ring-shaped intra-cavity second ohmic contact 151 can be positioned in the surrounding region on top of the second reflector 120. Current is injected via the ohmic contact 150, causing holes to be injected into the quantum wells 132 from the p-doped first reflector 140 and electrons to enter the quantum wells 132 from the n-doped second reflector 120. The holes and electrons recombine within the quantum wells 132 to generate light. Because the low refractive index dielectric layer 180 is an insulator, the current is injected in a ring region around the perimeter of the mesa 185. Although current can diffuse into the region near the central axis 102, it would be beneficial to have the injected current overlap with the region where the optical mode intensity is largest, near the central region of the VCSEL.

As an alternative to the low refractive index dielectric layer 180, a transparent conductive oxide or a transparent conductive nitride can be positioned directly on the top semiconductor layer of the first reflector 140. Because the transparent conductive oxide or nitride is electrically conducting, current injected through the ohmic contact 150 will allow current to be injected directly into the central region of the mesa 185 comprising the transparent conductive oxide or nitride.

Any combination of the above elements can be used to form the central region of the VCSEL structure closest to the central axis 102 to create a region that has a higher reflectivity than the surrounding region. The central region can include one or more elements selected from the group comprising: one or more pairs of semiconductor layers forming a distributed Bragg reflector, one or more pairs of dielectric layers forming a distributed Bragg reflector, one or more pairs of transparent conductive layers forming a distributed Bragg reflector, a non-conductive dielectric layer, transparent conductive oxide layer, a transparent conductive nitride layer, and a metallic layer. For example, the central region can be made of a DBR with dielectric layers and a metallic layer with a DBR with semiconductor layers.

Further, by reducing the number of semiconductor layer pairs in the first reflector 140, the ohmic contact 150 is closer to the heat generated inside the cavity 130. Thus, the thermal conductivity from the VCSEL to the ohmic contact 150 is increased and is able to more effectively extract heat from the structure. Additionally, with fewer semiconductor layer pairs in the first reflector 140, the electrical resistance of the structure is reduced, resulting in a lower VCSEL resistance and faster time constant so that the VCSEL output can be modulated at a faster rate.

The diameter, $d_{mesa}$, of the mesa 185 is smaller than the diameter of the oxide aperture, $d_{ox}$. 143, such that only the mode that matches the size of $d_{mesa}$ experiences a large enough cavity Q to lase. If the size of $d_{mesa}$ is sufficiently small, approximately three microns, then only the mode that matches the size of $d_{mesa}$ experiences a large enough cavity Q to lase. In other words, the VCSEL structure is a loss-guided structure where the difference in reflectivity in the central region and the surrounding region controls which mode lases in the structure. While other side modes may also laser, the VCSEL structure of FIG. 1B is referred to as a single spatial mode VCSEL because the power of the suppressed side modes are at least 25 dB lower than the main single spatial mode. Additionally, the mesa 145 results in a spatial refractive index step that optically guides the single transverse mode. The oxide layer 142 can also produce a refractive index step that guides the single transverse mode. While the mode 170 shown in FIG. 1B is the fundamental mode, the single mode at which the VCSEL is made to lase does not have to be the fundamental mode. In some implementations, the reflective mesa 185 may be fabricated in a different shape to support a higher order mode, such as a ring-shaped mode.

The VCSEL 100B is bottom-emitting because light is emitted through the second reflector 120 since the second reflector 120 has a lower reflectivity than the first reflector 140. The light subsequently passes through the substrate 110, as the material of the substrate 110 is selected to be transparent to the lasing wavelength of the VCSEL. In an alternate embodiment, the substrate 110 is selected to be semi-transparent. In some implementations, the substrate 114a may be gallium arsenide, and the VCSEL 100B lases at a wavelength between 950 nm and 1200 nm. In some implementations, the VCSEL 100B lases at a wavelength between 1030 nm and 1280 nm.

A bottom-emitting VCSEL laser has many advantages. Because flip chip connections can be used with a bottom-emitting VCSEL, wire bonding is not needed, and as a result, there is better signal integrity between laser driver circuits and the VCSEL. Further, the substrate surface that is not coupled to the second reflector 120 can be etched and formed into a lens shape to act upon the light emitted by the VCSEL. The lens of the substrate is integrated with the VCSEL structure, thus eliminating the need to actively align an external lens to the output of the VCSEL.

Figure 1C:
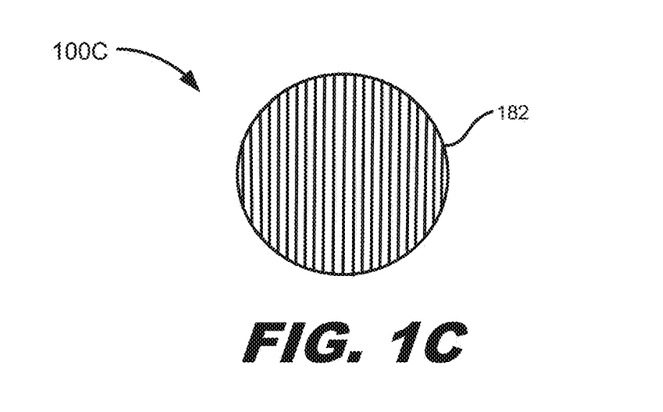
FIG. 1C depicts a top view of an example reflector in a VCSEL that causes the VCSEL to lase in a single polarization.

Although the structure of VCSEL 100B can be made to lase in a single transverse mode, there are still two degenerate polarizations supported by the structure. In some implementations, a grating may be etched in the metallic layer 182 on top of the mesa 145 to reflect a single polarization more strongly and, thus, lock in a particular polarization state of the VCSEL output. FIG. 1C depicts a top view of an example reflector where grooves are etched in the top of the mesa 145 of a VCSEL 100B that causes the VCSEL 100B to lase in a single polarization.

Further, an optical isolator 199, such as a Faraday isolator, may be positioned after the output of the VCSEL 100B. As optical isolator 199 transmits light in a single direction, in this case, away from the VCSEL 100B, the optical isolator 199 prevents reflections of the VCSEL output from re-entering the VCSEL 100B, potentially causing the VCSEL output to be noisy. To maximize the amount of light transmitted through the optical isolator 199, the input polarizer of the optical isolator 199 should be aligned with the direction of the single polarization of light emitted by the VCSEL 100B.

The VCSEL 100B may be directly modulated. In some implementations, VCSEL 100B may be modulated up to 25 Gb/s (gigabits per second). In some implementations, VCSEL 100B may be modulated using a pulse amplitude modulation technique, for example PAM-4. With PAM-4, four different pulse amplitudes are used for transmitting data. Each of four amplitude levels 1, 2, 3, and 4 can be represented by two bits: 00, 01, 11, and 10, respectively, and each pair of these bits may be referred to as a symbol. Thus, when one of the four amplitudes is transmitted in a symbol period, two bits are transmitted together. By using the PAM-4 modulation technique, VCSEL 100B may be modulated up to 25 GS/s (giga-symbols per second), thus doubling the data rate from modulating VCSEL 100B at 25 Gb/s without using the PAM-4 modulation technique.

With the use of four VCSELs, as described below with respect to the portion of the example transmission system 300A shown in FIG. 3A, and direct modulation of each of the four VCSELs at 25 Gb/s, a total throughput of 100 Gb/s can be achieved with the transmission system. And by using the PAM-4 modulation technique, an increased throughput of 100 GS/s may be achieved.

Returning to the example of FIG. 1A, the optical fiber 120a may be an optical fiber that supports a single spatial mode without supporting higher order spatial modes over a range of wavelengths, for example, standard telecommunications optical fiber SMF-28 made by Corning, Inc. of Corning, N.Y. that is single mode for wavelengths greater than 1260 nm. For a VCSEL lasing in the near infrared wavelength range of 950 nm to 1200 nm, SMF-28 fiber will support two spatial modes. In some implementations, a different single mode fiber may be used that supports a single spatial mode over a wavelength range that overlaps at least a portion of the emission wavelength range of the single mode VCSEL. Alternatively, even if the single mode fiber supports multiple spatial modes over an overlapping range of wavelengths with the VCSEL, the optical fiber 120a may be optimized to have lower bend loss than SMF-28 at the emission wavelength range of the single mode VCSEL.

The length of the optical fiber 120a may be sufficiently long to use in a data center. In some implementations, the optical fiber 120a may be greater than 50 meters. In some implementations, the optical fiber 120a may be as long as two or more kilometers with the single mode VCSEL being modulated at 25 Gb/s or higher and the transmission system 100A would still be minimally impacted by modal dispersion.

In some implementations, a spatial mode filter may be positioned downstream from an optical connector that may be used in the transmission system 100 where a higher order mode may be excited due to an offset of the core of the optical fiber 120a in the connected sections. For example, if fiber connectors are used between segments of the optical fiber 120a, a second order spatial mode may be excited in the optical fiber 120a. If the second order spatial mode is weakly guiding, the use of a spatial mode filter after the fiber connector preferentially induces attenuation for the second order spatial mode, thus effectively eliminating the second order spatial mode. In one non-limiting example, a spatial mode filter may be produced by wrapping a portion of the optical fiber 120a around a mandrel. In another example, a section of different fiber could be spliced into a fiber cable, such as SMF-28 cable, between the two end point connectors. This fiber can be designed to support a single spatial mode at the emission wavelength of the VCSELs. One method for making this different fiber is to construct a smaller core diameter than the SMF-28 fiber which then radiates away any second order spatial mode existing in the SMF-28 fiber. To avoid any additional losses at the splicing points, an adiabatic transition can be used which can transform the different mode sizes without any fundamental loss. Another method for constructing a spatial mode filter is to taper the SFM-28 fiber to a smaller diameter so that the second order mode is radiated into the cladding while allowing the lowest order mode to be transmitted with minimal loss. Additional methods for spatial mode filtering include periodic gratings in the fiber which can induce preferential loss by coupling the second order mode into the fiber cladding while allowing the first order mode to pass through with minimal loss.

The receiver 130a in FIG. 1A may include any type of sensor capable of sensing the VCSEL emission wavelength, such as a photodiode.

Figure 2:
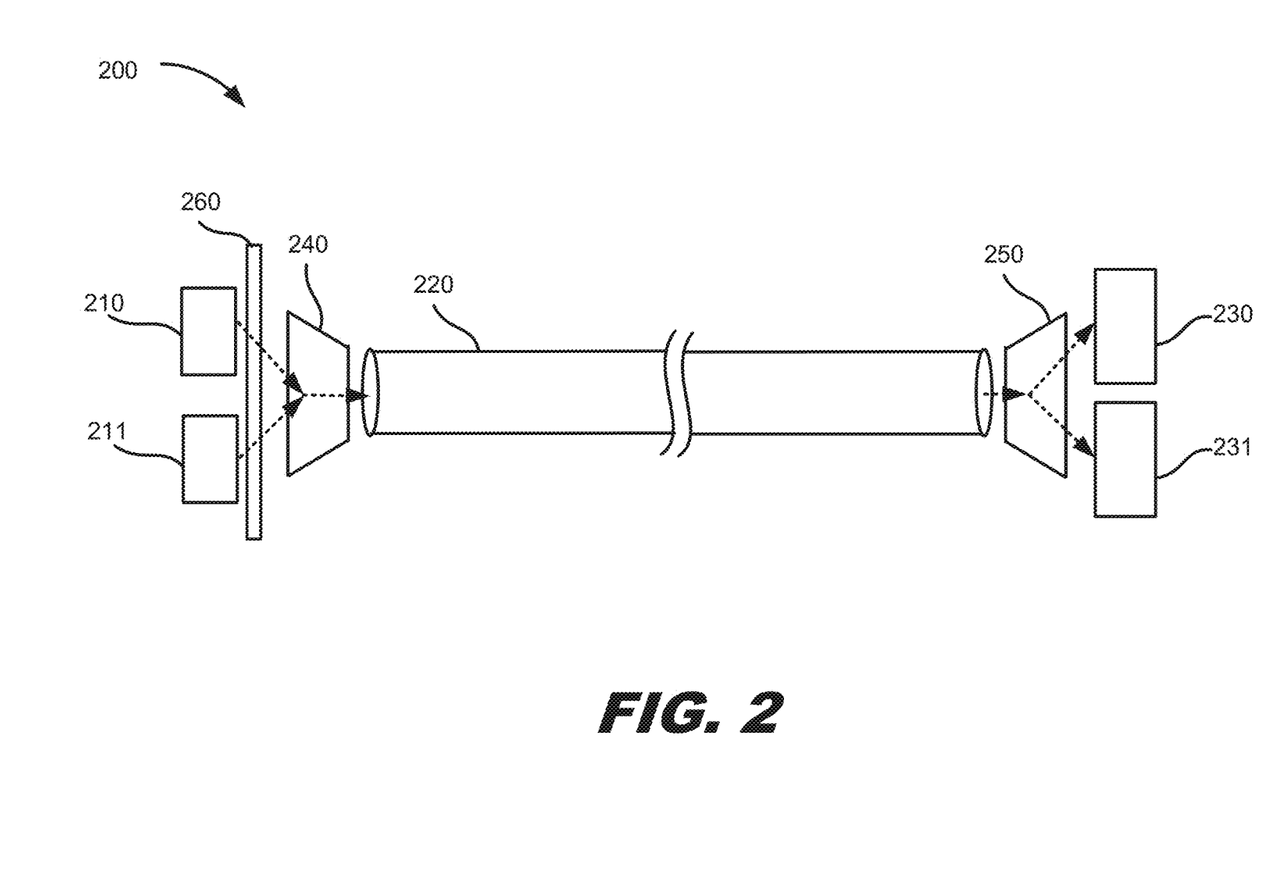
FIG. 2 depicts an example data center transmission system. With multiple optical sources

FIG. 2 depicts an example data center transmission system 200 with multiple optical sources. The system 200 may include multiple transmitters 210, 211 and multiple receivers 230, 231. While only two transmitters 210, 211 and only two receivers 230, 231 are shown, any number of transmitters and receivers greater than one may be used in the data center transmission system 200.

The transmitters 220, 221 may be similar to transmitter 110a described above. In some implementations, an optical isolator 260 may be positioned after the output of the VCSELs in the two transmitters 220, 221, where the VCSELs each lase in a single polarization. Because the cross-section of a Faraday isolator is fairly large in comparison to VCSELs and their output beams, a single isolator 260 may be used with multiple transmitters 220, 221, as long as the output polarizations of the VCSELS are appropriately aligned with respect to the input polarizer of the optical isolator 260.

The system 200 also includes a multiplexer 240 to multiplex the signals from the transmitters 210, 211. The multiplexed signals from the multiplexer 240 are directed into the optical fiber 220. The optical fiber may be similar to optical fiber 120a described above. After propagation along the optical fiber 220, the light signals are demultiplexed by a demultiplexer 250, and the signals are directed to the receivers 230, 231. The receivers 230, 231 may be similar to receiver 130a described above.

The term 'multiplex' as used herein may refer to wavelength multiplexing, polarization multiplexing, or space-division multiplexing. For example, with wavelength multiplexing, inputs to the multiplexer 240 have different wavelengths, and the output of the multiplexer 240 includes the different wavelengths of the inputs. With polarization multiplexing, inputs to the multiplexer 240 have different polarizations, and the output of the multiplexer 240 includes the different polarizations. With space-division multiplexing, inputs to the multiplexer 240 have different spatial modes, such as a lowest order Gaussian mode and a higher order mode, for example, a dumb-bell shaped mode, and the output of the multiplexer 240 includes the different spatial modes.

Similarly, the term 'demultiplex' as used herein may refer to wavelength demultiplexing, polarization demultiplexing, or space-division demultiplexing. Thus, if the multiplexer 240 performs a particular type of multiplexing, the selected demultiplexer 250 performs the same type of demultiplexing.

Figure 3A:
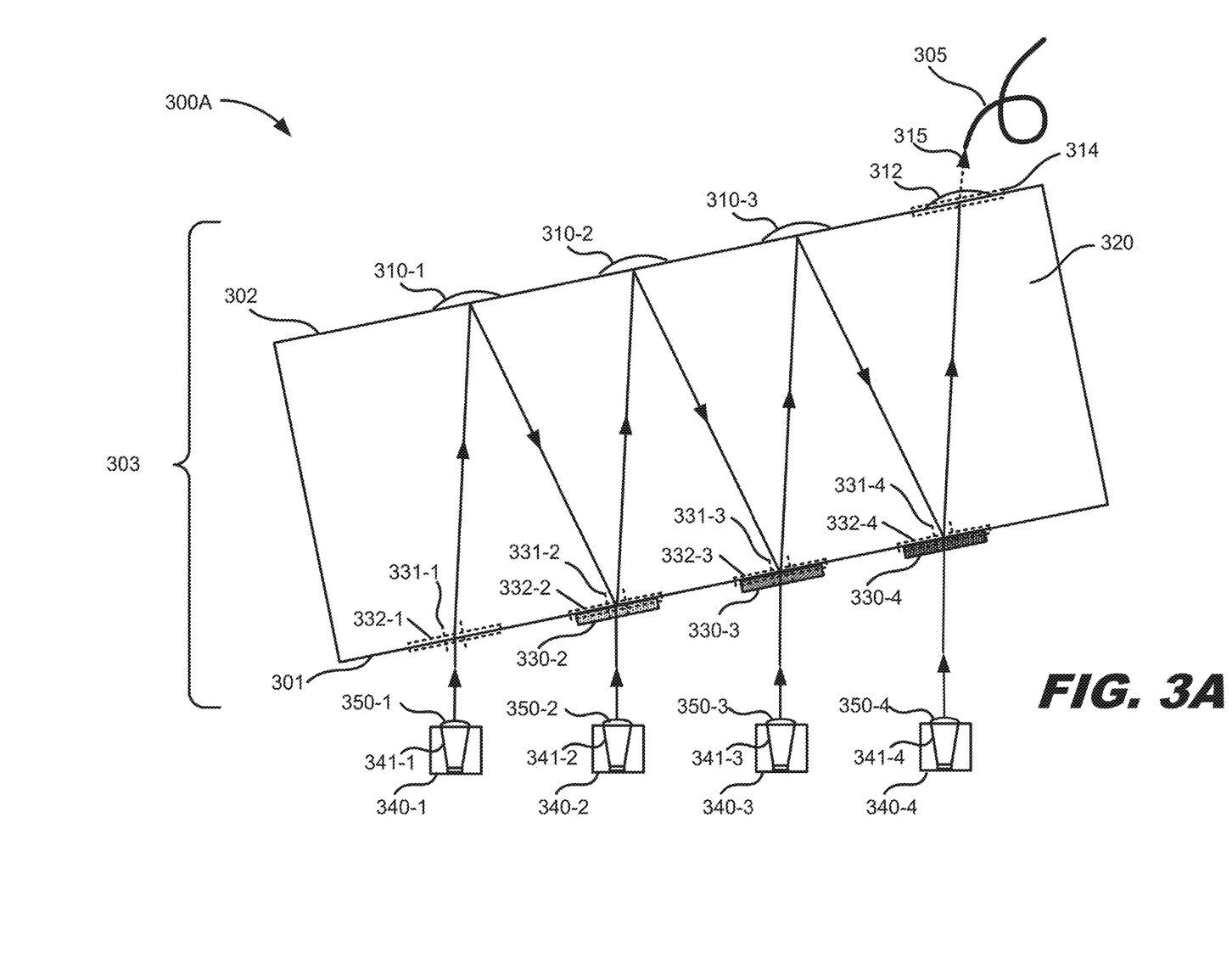
FIG. 3A depicts an example of a portion of a data center transmission system with a multiplexer including a transmissive optical block and wavelength-selective filters.
Figure 3B:
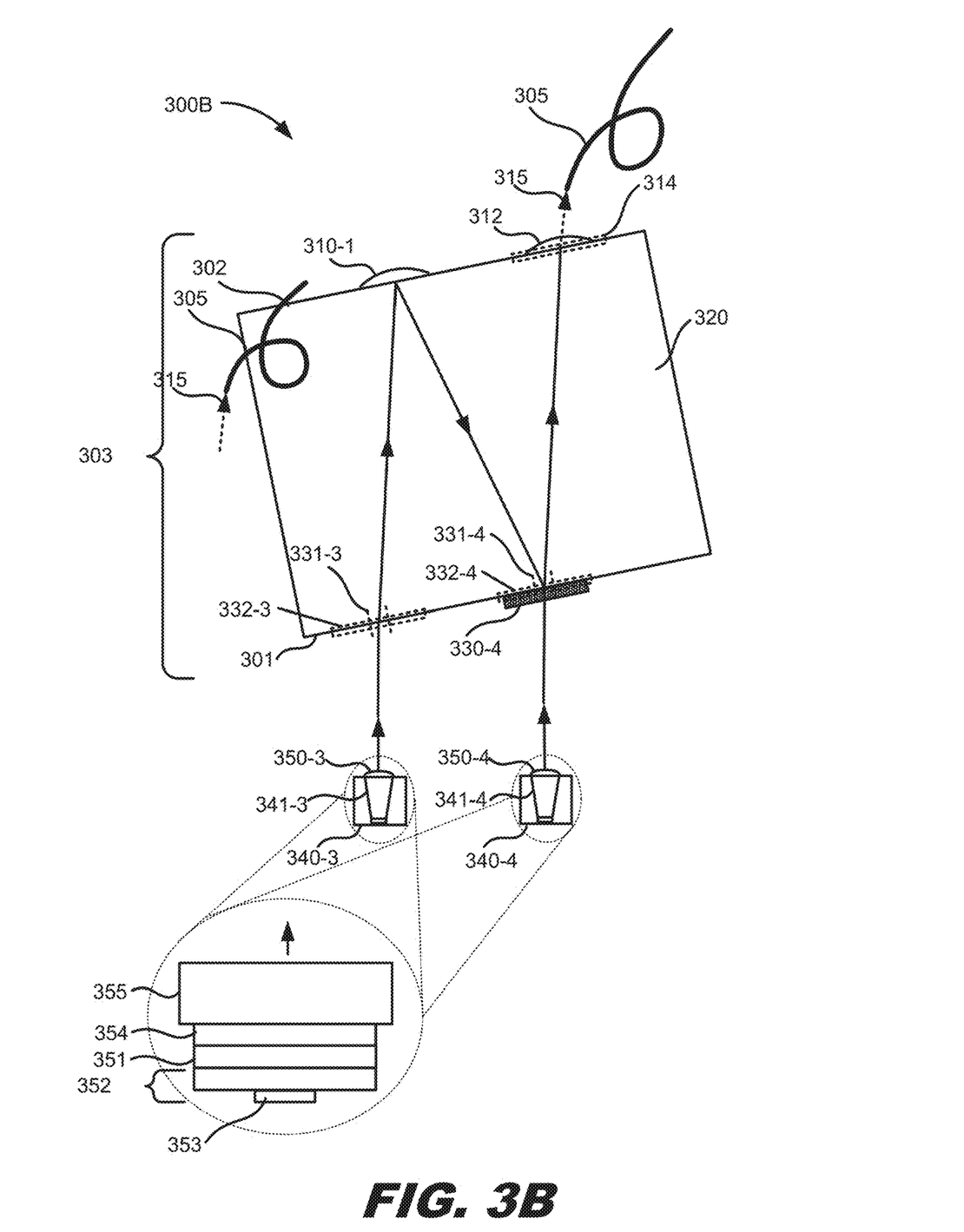
FIG. 3B depicts another example of a portion of a data center transmission system with a multiplexer including a transmissive optical block and wavelength-selective filters.

FIG. 3A depicts an example of a portion 300A of a data center transmission system with a multiplexer 303 including a transmissive optical block 320 and selective filters 330. Four optical sources 340 are multiplexed, as shown in FIG. 3A, but any number of optical sources, greater than one, can be used. FIG. 3B shows the case of two multiplexed optical sources 340.

The optical sources 340 are bottom-emitting directly modulated VCSELs that lase in a single transverse mode, as described with reference to FIG. 1B above. As shown in the inset of FIG. 1B, each VCSEL 340 has a light generation region 351 between a first and second reflector 352, 354, and the first reflector 352 has higher reflectivity in a central area 353 corresponding to a central region of a lowest order cavity mode to cause the VCSEL to lase in a single transverse mode with a side mode suppression ratio of at least 25 dB. Further, each VCSEL is formed on a substrate 355 and lases at a wavelength that is transparent or semi-transparent to the substrate, and an output of each VCSEL exits through the substrate 355.

The optical body 320 is optically transmissive at the VCSEL lasing wavelengths and has two opposing surfaces, a first surface 301, and a second surface 302. The distance between the first surface 301 and the second surface 302 is uniform along the length of the optical body 320, for example, as with a slab or block-shaped body. On the first surface 301 are input regions 332, also referred to as input areas, where light beams 341 emitted by the optical sources 340 impinge on the optical body 320. The input regions 332 are distinct from each other. On the second surface 302 is an output region 314, also referred to as an output area, that outputs a multi-wavelength exit light beam 315, where the exit light beam 315 includes at least some light from each of the optical sources 340.

The optical sources 340 are positioned so that each emitted light beam 341 is received at the optical body 320 at a different input region 332 on the first surface 301 of the optical body 320. Each optical source 340 has a corresponding lens 350 to image the emitted light beam 341, for example, to a beam waist 331 at the input region 332 at the first surface 301 of the optical body 320

Coupled to each input region 332, except for the input region 332-1 farthest from the output region 314, is a selective filter 330. As used herein, a selective filter may refer to a wavelength selective filter, a polarization selective filter, or a spatial mode selective filter. For example, a wavelength-selective filter reflects light, e.g., at greater than 50% reflectivity, at a first set or group of wavelengths and transmits light, e.g., at greater than 50% transmissivity, at a second set or group of wavelengths. With the use of wavelength-selective filters as the selective filter 300, the output from each VCSEL 351 may have the same polarization and/or spatial mode but different emission wavelength.

With a polarization-selective filter, a particular polarization is transmitted while other polarizations are reflected. With the use of polarization-selective filters as the selective filter 300, the output from each VCSEL 351 may have the same emission wavelength and/or spatial mode but different polarizations.

With a spatial mode-selective filter, a particular spatial mode is transmitted, for example, the lowest order mode, while other spatial modes are reflected. With the use of spatial mode-selective filters as the selective filter 300, the output from each VCSEL 351 may have the same emission wavelength and/or polarization but different spatial modes.

While the group of selective filters 330 may be selected to be any type of selective filter, for clarity, the description below will focus on the operation of transmission system 300A with the use of wavelength-selective filters. The first set of wavelengths reflected by each wavelength-selective filter 330 is different from the second set of wavelengths transmitted by that wavelength-selective filter 330, and each wavelength-selective filter 330 transmits a different second set of wavelengths from the other wavelength-selective filters 330. For example, the set of wavelengths emitted by optical source 340-2 that is transmitted by wavelength-selective filter 330-2 is different from the set of wavelengths emitted by optical source 340-3 that is transmitted by wavelength-selective filter 330-3 and is also different from the set of wavelengths emitted by optical source 340-4 that is transmitted by wavelength-selective filter 330-4. In general, the peak wavelength of the optical source 340 may be matched to the peak transmission wavelength of the corresponding wavelength-selective filter 330 to minimize optical power loss in the system 300A. Wavelength-selective filters 330 can be made of multiple layers of dielectric material having different refractive indices. A wavelength-selective filter can also be referred to as a wavelength-dependent filter or a wavelength selective element.

Light beams transmitted by the wavelength-selective filters 330, except for selective filter 330-4 closest to the exit region 314, and the emitted light beam received at input region 332-1 from optical source 340-1 each travel from surface 301 through the optical body 320 to impinge upon a reflective focuser 310 coupled to the second surface 302 of the optical body 320. Each reflective focuser 310 reflects and focuses an incoming light beam to a different one of the wavelength-selective filters 330 at the input regions 332. Examples of a reflective focuser can include a multi-layer stack of dielectric thin films; a Fresnel lens; a curved mirror lens, such as made with a metallic surface, e.g., gold; and a high-contrast grating reflector. A reflective focuser can also be referred to as a focusing mirror, a focusing reflector or a focuser.

Upon hitting the wavelength-selective filters 330 from within the transmissive optical block 320, at least some portion of the light beams are reflected back toward the second surface 302 of the optical body 320. Each wavelength-selective filter 330, except for the wavelength-selective filter 330-4 closest to the exit region 314, reflects light to one of the reflective focusers 310, as discussed above. Each wavelength-selective filter 330 also transmits a light beam from an optical source 340. Light within the optical body 320 is redirected alternately between the wavelength-selective filters 330 and the reflective focusers 310 until the light hits the wavelength-selective filter 330-4 closest to the exit region 314.

Wavelength-selective filter 330-4 reflects the light beam from within the optical body 320 to the exit region 314. Wavelength-selective filter 330-4 also transmits a light beam from the corresponding optical source 340-4. The reflected and transmitted light beams together make up the exit light beam that is directed toward the exit region 314. The exit light beam 315 includes at least some light from each of the optical sources 340, thus, multiplexing the light beams from the optical sources 340.

Coupled to the exit region 314 in FIG. 3A may be an output lens 312 configured to image the light beam, for example, at the input region 332-4, to another location, such as the input to single mode optical fiber 305. The output lens 312 can also image the light beam at the input region 332-4 to an intermediate location before being imaged to the optical fiber 305.

Figure 4A:
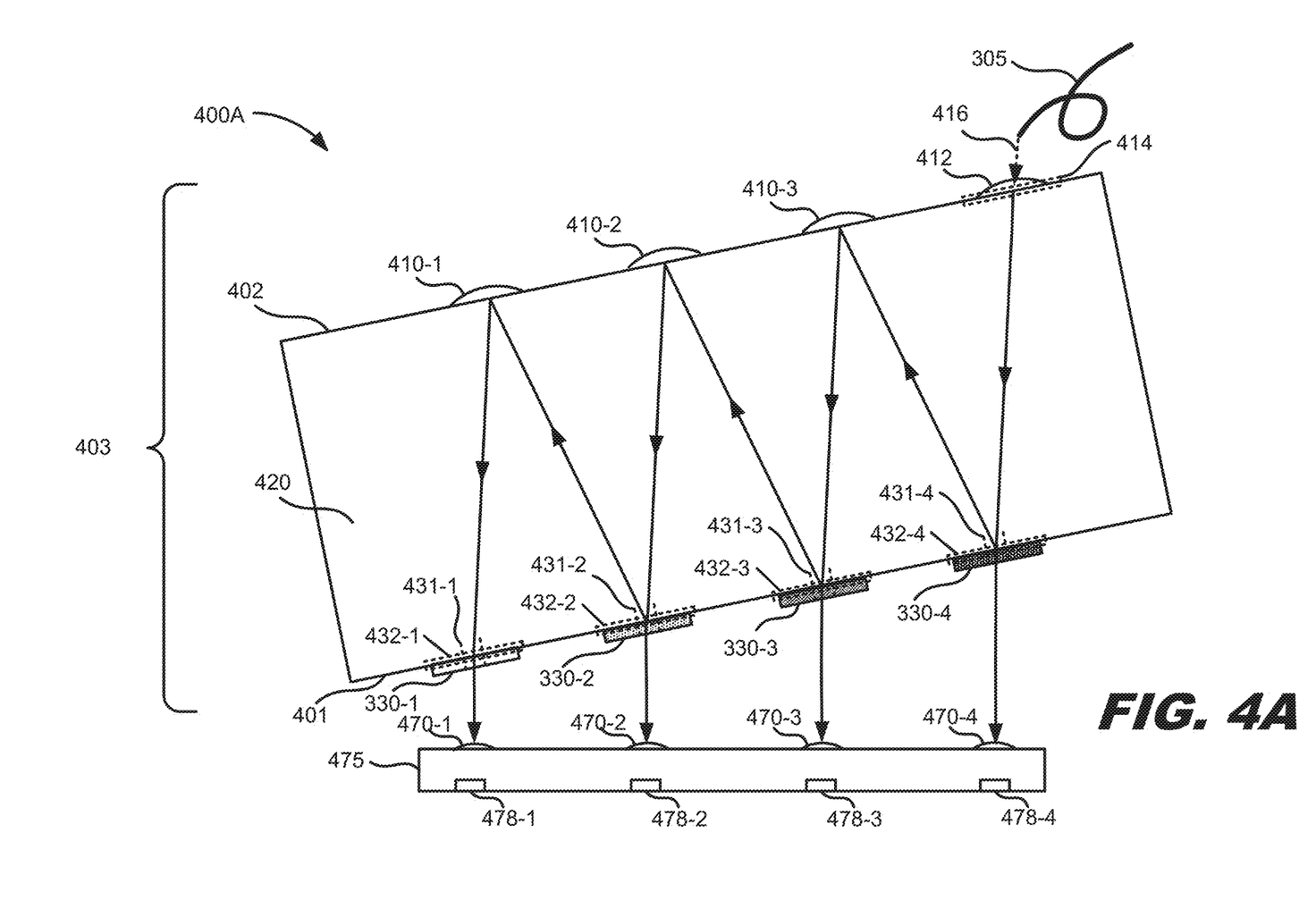
FIG. 4A depicts an example of a portion of a data center transmission system with a demultiplexer including a transmissive optical block and wavelength-selective filters.
Figure 4B:
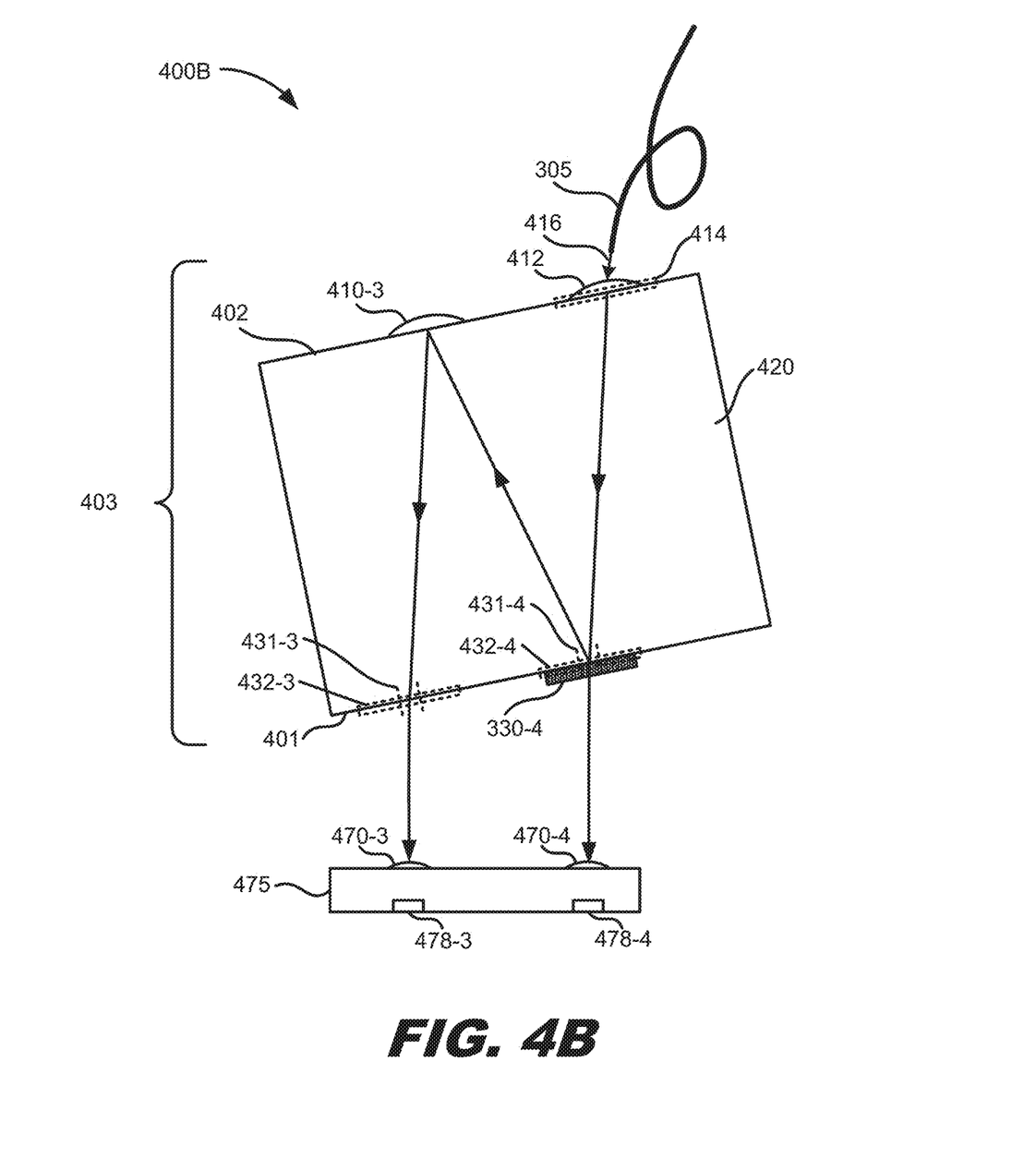
FIG. 4B depicts another example of a portion of a data center transmission system with a demultiplexer including a transmissive optical block and wavelength-selective filters.

FIG. 4A depicts an example of a portion 400A of a data center transmission system with a demultiplexer 403 including a transmissive optical block 420 and wavelength-selective filters 330. Four optical detectors 478 are shown in the example of FIG. 4A for demultiplexing four signals. FIG. 4B shows the case of two optical detectors 478 for demultiplexing two optical signals.

Many of the elements of the multiplexer system 300A in FIG. 3A are also used in the demultiplexer system 400A, for example, the reflective focusers 310 and the wavelength selective filters 330. For consistency, the first surface of the optical body 420 refers to the surface to which the selective filters are coupled, and the second surface of the optical body 420 refers to the surface to which the reflective focusers 410 are coupled.

The multi-wavelength light beam 416 from the optical fiber 305 enters the optical body 420 at input region 414 on the second surface 402 of the optical body 420. Lens 412 is coupled to optical body 420 at input region 414. Lens 412 may, for example image the multi-wavelength light beam 416 from the optical fiber 305 to a beam waist 431-4 at output region 432-4. One or more other lenses (not shown) can be used with lens 412 to perform the imaging.

Coupled to the output region 432-4 is the selective filter 330-4. As discussed above, a selective filter may refer to a wavelength selective filter, a polarization selective filter, or a spatial mode selective filter. The type of selective filter 330 in the demultiplexer 403 is the same as the type of selective filter 330 in the multiplexer 303.

Again, for clarity, the description below will focus on the operation of transmission system 400A with the use of wavelength-selective filters. Wavelength-selective filter 330 reflects light, e.g., at greater than 50% reflectivity, at a first set of wavelengths and transmits light, e.g., at greater than 50% transmissivity, at a second set of wavelengths, where the first set of wavelengths is different from the second set of wavelengths, and each wavelength-selective filter 330 transmits a different second set of wavelengths. A portion of the multi-wavelength beam 416 is transmitted by the wavelength-selective filter 330-4 to detector 478-4.

The detectors can be any type of sensor capable of sensing the VCSEL emission wavelengths, such as a photodetector or a PIN photodiode. In the example of FIG. 4A, a PIN substrate 475 is shown having four PIN diodes 478. Coupled to the top surface of the PIN substrate 475 are two integrated detector lenses 470, positioned to focus incoming light onto the corresponding PIN diode. Because the active area of the PIN diodes may be smaller than the beam diameter 431, the detector lens 470 can focus the light beam spot onto the active area.

Each detector lens 470 is positioned to receive a light beam transmitted from a corresponding wavelength-selective filter 330. While four wavelength-selective filters 330 and PIN diodes are shown in the example of FIG. 4A, the demultiplexer system 400A can have any number of wavelength-selective filters 330 and corresponding PIN diodes greater than one. The wavelengths reflected by wavelength-selective filter 330-4 travel through the optical body 420 until a reflective focuser 410-3 coupled to the second surface 402 is reached. As described above, the reflective focuser may perform imaging of the beam waist at the output region 432-4 to a different output region. Similar to the multiplexer 303, light is re-directed within the optical body 420 alternately between the wavelength-selective filters 330 and the reflective focusers 110 until the light beam hits a wavelength-selective filter 330 that allows the light to exit the optical body 420. The light that exits the optical body is then focused by a detector lens 470 onto the active area of a corresponding sensor 478.

In some cases, the same optical body 420 can be used for both multiplexing and de-multiplexing signals. For example, the multiplexing portion can be adjacent to the demultiplexing portion, or the multiplexing portion can be interleaved with the demultiplexing region.

In some implementations, as shown in the example of FIG. 3B, the data center transmission system includes a first VCSEL and a second VCSEL, each directly modulated at at least 25 Gb/s, where the first and second VCSELs each have a light generation region between a first and second reflector, and the first reflector has higher reflectivity in a central area corresponding to a central region of a lowest order cavity mode to cause the VCSEL to lase in a single transverse mode with a side mode suppression ratio of at least 25 dB, and where each VCSEL is formed on a substrate and lases at a wavelength transparent to the substrate, and an output of each VCSEL exits through the substrate. The system also includes a multiplexer to multiplex an output of the first VCSEL and the second VCSEL. The multiplexer includes a first transmissive optical block having a first input region on a first surface to receive the output of the first VCSEL, a second input region on the first surface to receive the output of the second VCSEL, and an output region on a second surface of the block to output multiplexed light; a first mirror coupled to the second surface to reflect the output of the first VCSEL within the block to the second input region; and a first selective filter coupled to the second input region to transmit light from the second VCSEL and reflect light from the first VCSEL, where the multiplexed light includes output from the first and second VCSELs. Further, the system includes an optical fiber along which the multiplexed light propagates.

In some implementations, as shown in the example of FIG. 4B, the system also includes a demultiplexer to demultiplex light after propagation through the optical fiber. The demultiplexer includes a second transmissive optical block having a first input region on a first surface to receive the light that propagated through the optical fiber; a second selective filter coupled to a first output region on a second surface of the block to transmit light from the second VCSEL and reflect light from the first VCSEL, where the second surface is opposite the first surface of the block; and a second mirror coupled to the first surface to reflect light from the first VCSEL within the block to a second output region on the second surface. Further, the system includes a first receiver to receive light from the first output region of the second block, and a second receiver to receive light from the second output region of the second block.

In some implementations, the system also includes a first spatial mode filter positioned to spatially filter the multiplexed light in the optical fiber. In some implementations, each central area of the first reflector of each of the first VCSEL and the second VCSEL has a plurality of grooves to cause the VCSEL to lase in a single polarization, and the system also includes a first isolator between the first VCSEL and the multiplexer and a second isolator between the second VCSEL and the multiplexer. In some implementations the substrate on which each of the first and second VCSELs are formed is gallium arsenide, and the first and second VCSELs lase at different wavelengths in a range between 1030 nm and 1280 nm.

Figure 5:
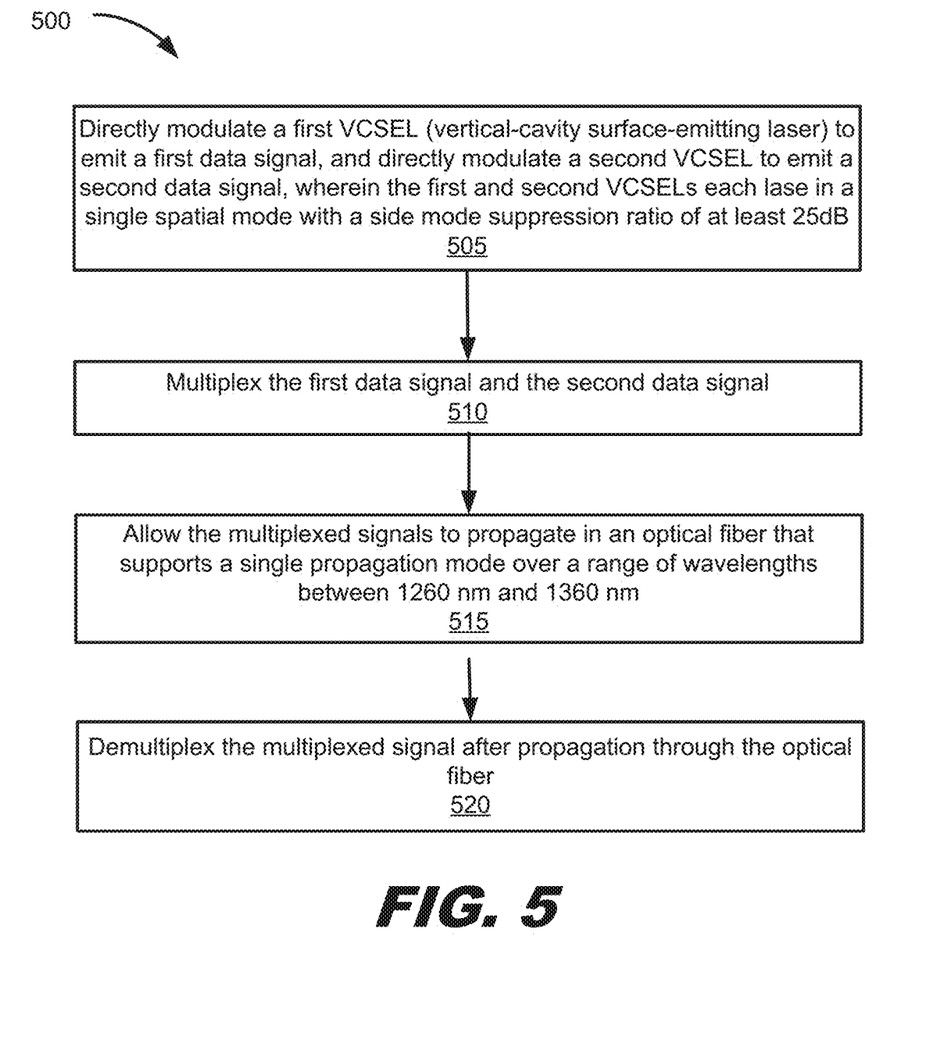
FIG. 5 depicts a flow diagram illustrating an example process of operating a data center transmission system.

FIG. 5 depicts a flow diagram illustrating an example process 500 of operating a data center transmission system.

The process begins at block 505, where a first VCSEL may be directly modulated to emit a first data signal, and a second VCSEL may be directly modulated to emit a second data signal. The first and second VCSELs each lase in a single spatial mode with a side mode suppression ratio of at least 25 dB. In some implementations, the single spatial mode may be the lowest order mode or a higher order mode, such as a ring-shaped mode.

At block 510, the first data signal and the second data signal may be multiplexed by a multiplexer that performs wavelength multiplexing, polarization multiplexing, or spatial-mode multiplexing.

At block 515, the multiplexed signals may be allowed to propagate in an optical fiber that supports a single spatial mode without supporting higher order spatial modes over a range of wavelengths. In some implementations, the range of wavelengths may include the range between 1260 nm and 1360 nm.

At block 520, after propagation through the optical fiber, the multiplexed signal may be demultiplexed by a demultiplexer, where the demultiplexer performs wavelength demultiplexing if wavelength multiplexing is performed at block 510' polarization demultiplexing if polarization multiplexing is performed at block 510; and spatial mode demultiplexing if spatial mode multiplexing is performed at block 510.

In some implementations, the first and second VCSELs may each lase at a different wavelength within a wavelength range from 1030 nm to 1280 nm. Additionally, a material of a first substrate on which the first VCSEL is grown is transparent or semi-transparent within the wavelength range 1030 nm to 1280 nm, and a material of a second substrate on which the second VCSEL is grown is also transparent or semi-transparent within the wavelength range 1030 nm to 1280 nm. Also, the first VCSEL emits the first data signal through the first substrate, and the second VCSEL emits the second data signal through the second substrate.

In some implementations, the first and second VCSELs may each be directly modulated at 25 Gb/s or higher. In some implementations, the first and second VCSELs may each be modulated at 25 GS/s or higher with the use of a PAM-4 modulation technique.

Figure 6:
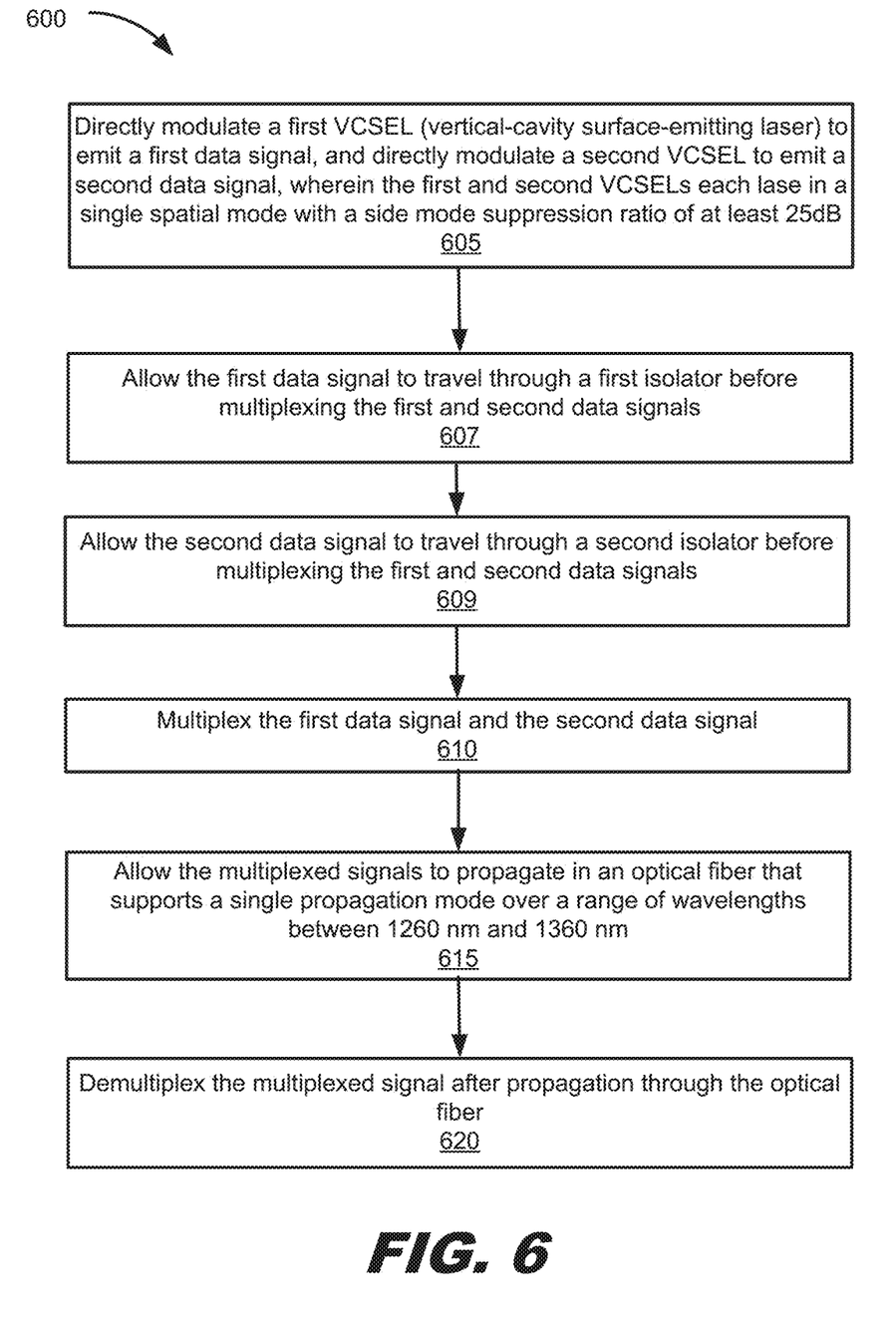
FIG. 6 depicts a flow diagram illustrating another example process of operating a data center transmission system.

FIG. 6 depicts a flow diagram illustrating another example process 600 of operating a data center transmission system.

The process begins at block 605 which may be similar to block 505 described with respect to process 500 of FIG. 5.

At block 607, the first data signal may be allowed to travel through a first isolator before multiplexing the first and second data signals.

At block 609, the second data signal may be allowed to travel through a second isolator before multiplexing the first and second data signals.

In some implementations, the first isolator and the second isolator may be the same isolator.

Blocks 610, 615, and 620 may be similar to blocks 510, 515, 520, respectively, of FIG. 5.

Not all of the steps or features presented above are used in each implementation of the presented techniques. Steps may be performed in a different order than presented.

As used in the specification and claims herein, the singular forms "a," "an," and "the" include plural referents unless the context clearly dictates otherwise.

What is claimed is:

1. A data center transmission system comprising:
a first VCSEL (vertical-cavity surface-emitting laser) and a second VCSEL, each directly modulated at at least 25 Gb/s,
wherein the first and second VCSELs each have a light generation region between a first and second reflector, and the first reflector has higher reflectivity in a central area corresponding to a central region of a lowest order cavity mode to cause the VCSEL to lase in a single transverse mode with a side mode suppression ratio of at least 25 dB,
wherein each VCSEL is formed on a substrate and lases at a wavelength transparent to the substrate, and an output of each VCSEL exits through the substrate;
a multiplexer to multiplex an output of the first VCSEL and the second VCSEL, comprising:
a first transmissive optical block having a first input region on a first surface to receive the output of the first VCSEL, a second input region on the first surface to receive the output of the second VCSEL, and an output region on a second surface of the block to output multiplexed light;
a first mirror coupled to the second surface to reflect the output of the first VCSEL within the block to the second input region; and
a first selective filter coupled to the second input region to transmit light from the second VCSEL and reflect light from the first VCSEL,
wherein the multiplexed light includes output from the first and second VCSELs; and
an optical fiber along which the multiplexed light propagates.

2. The system of claim 1, further comprising:
a demultiplexer to demultiplex light after propagation through the optical fiber, comprising:
a second transmissive optical block having a first input region on a first surface to receive the light that propagated through the optical fiber;
a second selective filter coupled to a first output region on a second surface of the block to transmit light from the second VCSEL and reflect light from the first VCSEL, wherein the second surface is opposite the first surface of the block; and
a second mirror coupled to the first surface to reflect light from the first VCSEL within the block to a second output region on the second surface; and
a first receiver to receive light from the first output region of the second block; and
a second receiver to receive light from the second output region of the second block.

3. The system of claim 1, further comprising:
a spatial mode filter positioned to spatially filter the multiplexed light in the optical fiber.

4. The system of claim 1, wherein each central area of the first reflector of each of the first VCSEL and the second VCSEL has a plurality of grooves to cause the VCSEL to lase in a single polarization, the system further comprising:
a first isolator between the first VCSEL and the multiplexer; and
a second isolator between the second VCSEL and the multiplexer.

5. The system of claim 1, wherein the substrate on which each of the first and second VCSELs are formed is gallium arsenide, and further wherein the first and second VCSELs lase at different wavelengths in a range between 1030 nm and 1280 nm.

6. A method comprising:
directly modulating a first VCSEL (vertical-cavity surface-emitting laser) to emit a first data signal, and directly modulating a second VCSEL to emit a second data signal, wherein the first and second VCSELs each lase in a single spatial mode with a side mode suppression ratio of at least 25 dB,
multiplexing the first data signal and the second data signal;
allowing the multiplexed signals to propagate in an optical fiber that supports a single spatial mode without supporting higher order spatial modes over a range of wavelengths between 1260 nm and 1360 nm;
demultiplexing the multiplexed signal after propagation through the optical fiber
allowing the first data signal to travel through a first isolator before multiplexing the first and second data signals; and
allowing the second data signal to travel through a second isolator before multiplexing the first and second data signals.

7. The method of claim 6,
wherein the first and second VCSELs each lase at a different wavelength within a wavelength range from 1030 nm to 1280 nm,
wherein a material of a first substrate on which the first VCSEL is grown is transparent at the wavelength range, and a material of a second substrate on which the second VCSEL is grown is transparent at the wavelength range, and
further wherein the first VCSEL emits the first data signal through the first substrate, and the second VCSEL emits the second data signal through the second substrate.

8. The method of claim 6, wherein the first and second VCSELs are each directly modulated at 25 Gb/s or higher.

* * * * *